US008580597B2

(12) United States Patent
Ollier et al.

(10) Patent No.: US 8,580,597 B2
(45) Date of Patent: Nov. 12, 2013

(54) MAKING OF A MICROELECTRONIC DEVICE INCLUDING A MONOCRYSTALLINE SILICON NEMS COMPONENT AND A TRANSISTOR THE GATE OF WHICH IS MADE IN THE SAME LAYER AS THE MOBILE STRUCTURE OF THIS COMPONENT

(75) Inventors: Eric Ollier, Grenoble (FR); Audrey Berthelot, St Ismier (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/257,756

(22) PCT Filed: Mar. 26, 2010

(86) PCT No.: PCT/EP2010/005023
§ 371 (c)(1),
(2), (4) Date: Sep. 20, 2011

(87) PCT Pub. No.: WO2010/112428
PCT Pub. Date: Oct. 7, 2010

(65) Prior Publication Data
US 2012/0009713 A1    Jan. 12, 2012

(30) Foreign Application Priority Data

Mar. 30, 2009    (FR) ...................................... 09 51986

(51) Int. Cl.
*H01L 21/00*    (2006.01)
(52) U.S. Cl.
USPC ...................... 438/50; 438/282; 257/E21.483
(58) Field of Classification Search
USPC ................................... 257/E21.483, E21.532
See application file for complete search history.

(56) References Cited

U.S. PATENT DOCUMENTS

| 6,087,701 | A | 7/2000 | Bergstrom et al. |
| 8,018,291 | B2 | 9/2011 | Duraffourg et al. |
| 2006/0270238 | A1 | 11/2006 | Izumi et al. |
| 2008/0076211 | A1 | 3/2008 | Casset et al. |
| 2009/0242896 | A1 | 10/2009 | Izumi et al. |

FOREIGN PATENT DOCUMENTS

| FR | 2 901 263 | 11/2007 |
| FR | 2 906 238 | 3/2008 |

OTHER PUBLICATIONS

Soumik Ghosh, et al., "On Integrated CMOS-MEMS System-on-Chip", The Third International conference IEEE-NEWCAS 2005, pp. 31-34.

(Continued)

*Primary Examiner* — Cheung Lee
(74) *Attorney, Agent, or Firm* — Oblon, Spivak, McClelland, Maier & Neustadt, L.L.P.

(57) ABSTRACT

A method for making a microelectronic device including, on a same substrate, at least one electro-mechanical component including a mobile structure of a monocrystalline semi-conductor material and a mechanism actuating and/or detecting the mobile structure, and with at least one transistor. The method a) provides a substrate including at least one first semi-conducting layer including at least one region in which a channel area of the transistor is provided, b) etches a second semi-conducting layer based on a given semi-conductor material, lying on an insulating layer placed on the first semi-conducting layer, to form at least one pattern of the mobile structure of the component in an area of monocrystalline semi-conductor material of the second semi-conducting layer, and at least one pattern of gate of the transistor on a gate dielectric area located facing the given region.

15 Claims, 7 Drawing Sheets

(56) References Cited

OTHER PUBLICATIONS

J. Teva, et al., "From VHF to UHF CMOS-MEMS Monolithically Integrated Resonators", IEEE-MEMS, Jan. 2008, pp. 82-85.

Bradford S. Davis, et al., "A Monolithic high-g SOI-MEMS Accelerometer for Measuring Projectile Launch and Flight Accelerations", IEEE 2004, pp. 296-299.

E. Colinet, et al., "Measurement of Nano Displacement Based on in-Plane Suspended Gate MOSFET Detection Compatible with Front-End CMOS process", ISSCC 2008 Conference, San Francisco, USA, Feb. 2008, 8 pgs.

MAKING OF A MICROELECTRONIC DEVICE INCLUDING A MONOCRYSTALLINE SILICON NEMS COMPONENT AND A TRANSISTOR THE GATE OF WHICH IS MADE IN THE SAME LAYER AS THE MOBILE STRUCTURE OF THIS COMPONENT

TECHNICAL FIELD

The present invention relates to the field of microelectronic devices provided with at least one NEMS (Nano Electro-Mechanical Systems) and/or MEMS (Micro Electro Mechanical Systems) component cointegrated on a same substrate with at least one transistor.

The invention allows to form a mobile structure of a MEMS or NEMS component in a monocrystalline Si, and a transistor from a same semi-conducting layer, and provides improvements in particular in terms of the number of manufacturing method steps required to make the MEMS component and the electronic circuit.

PRIOR ART

It is known to integrate on a same substrate, a NEMS and/or MEMS structure with one or more transistors of a CMOS circuit is known.

For this, there are different methods, which have been, for example, described in document: "*On Integrated CMOS-MEMS System-on-Chip*", Soumik Ghosh et Magdy Bayoumi, conference IEEE-NEWCAS 2005, pp. 31-34.

One approach called "pre-CMOS" specifies making a MEMS structure prior to making the components of the CMOS circuit.

According to another approach, called "intermediate CMOS", steps for making the CMOS circuit called "Front-end" or "Back-End" are interrupted in order to make the MEMS.

A third approach called "post-CMOS", specifies defining the MEMS mobile structure after the CMOS components, which imposes significant constraints on the choice of materials and the method conditions used in order to meet the thermal budget constraints.

A drawback common to these different approaches is related to the number of manufacturing steps required to make the MEMS component and CMOS circuit.

Document: "*From VHF to UHF CMOS-MEMS monolithically integrated resonators*" Teva et al., IEEE-MEMS January 2008, discloses a method for making a microelectronic device wherein the mobile mechanical structure of a MEMS is made from polysilicon layers also used to form the gate of a MOS transistor.

However, the use of polycrystalline silicon for making the mobile structure of a MEMS restricts the mechanical performances as well as the reliability of this MEMS structure.

Document FR2906238 discloses the manufacture of a MEMS structure of monocrystalline silicon, cointegrated with a transistor. The transistor and MEMS structure are made using a SON (Silicon on Nothing) technology wherein the channel of transistors is kept above a cavity.

To make transistors with the SON technology, a selective etching of a first SiGe area can be carried out with respect to a second Si area lying on this first area and intended to form the channel. The total SiGe removal is difficult to achieve when the critical dimension of the SiGe area is important, which imposes to make low channel size transistors.

Another document: "*A monolithic high-g SOI-MEMS accelerometer for measuring projectile launch and flight accelerations*", Bradford D. Davis et al., IEEE 2004, discloses an integration method wherein, in a same silicon layer, a mobile structure of a MEMS and channels of transistors of a CMOS circuit are formed.

The method described in this document is restricted in terms of lithography resolution of the MEMS mechanical structure, which is made after that of the interconnecting metal lines.

The raised issue is to find a new method for making a microelectronic device including a MEMS- or NEMS-type electromechanical system provided with a mobile structure of monocrystalline semi-conductor, as well as one or more transistors formed on a same substrate, wherein, in particular, the number of manufacturing steps required to make the MEMS structure and the transistors is reduced.

The invention also relates to a device implemented by a method such as described above.

DESCRIPTION OF THE INVENTION

The invention relates to a method for making a microelectronic device comprising, on a same substrate, at least one electro-mechanical component provided with a mobile structure of a monocrystalline semi-conductor material and means for actuating and/or detecting the mobile structure, and with at least one transistor, the method comprising the following steps of:

a) providing a substrate provided with at least one first semi-conducting layer including at least one given region wherein a channel area of the transistor is provided, an insulating layer covering the first semi-conducting layer, b) etching a second semi-conducting layer based on a given semi-conductor material, lying on said insulating layer covering said first semi-conducting layer, the etching being provided so as to form at least one pattern of said mobile structure of the component in an area of monocrystalline semi-conductor material of the material of the second semi-conducting layer, and at least one gate pattern facing said given region.

According to the method of the invention, the gate of the transistor and the mobile structure can be defined by etching in one step.

The method according to the invention is applicable to the making of transistors with different channel sizes, and is in particular applicable to the making of amplifying transistors which sometimes require a minimum channel size.

According to a first possible implementation of the method, the first semi-conducting layer can belong to a bulky substrate, commonly called "bulk".

In this case, the method can further comprise, prior to step b), forming said insulating layer on the first semi-conducting layer of the substrate.

According to this first implementing possibility, the method can further comprise: at least partially etching said insulating layer facing said given region to form a gate dielectric area for said transistor.

This gate dielectric area can be formed by etching said insulating area, then oxidizing the substrate so as to form a semi-conductor oxide area. This can allow to form a good quality gate dielectric.

The method can further comprise making at least one aperture in said insulating layer uncovering the first semi-conducting layer, forming at least one semi-conducting sacrificial area at the bottom of this aperture, and then forming said second semi-conducting layer by growth.

The semi-conducting sacrificial area is based on a crystalline semi-conductor material.

By growth, the second semi-conducting layer can thus be formed with a monocrystalline semi-conductor material area on said semi-conducting sacrificial area and a polycrystalline semi-conductor material area on said gate dielectric area and on the insulating layer.

The crystalline semi-conductor material of the semi-conducting sacrificial area can be based on a material selected so as to be etched selectively towards the first and second semi-conducting layers.

According to one possibility, the first semi-conducting layer can be Si- or Ge- or SiGe-based.

According to one possibility, the second semi-conducting layer can be Si- or Ge- or SiGe-based.

The crystalline semi-conductor material of the sacrificial area can be $Si_yGe_{1-y}$, in particular when the first semi-conducting layer and the second semi-conducting layer are Si-based.

According to one possibility, the method can further comprise, after forming the semi-conducting sacrificial area:
- forming at least a second insulating layer, so as to cover the second semi-conducting layer and surround the flanks of the mobile structure,
- removing a given thickness of said second insulating layer facing said structure,
- releasing the mobile structure by etching selectively the second insulating layer towards the semi-conductor material of the second semi-conducting layer.

The method can further comprise removing the semi-conducting sacrificial area.

This can be carried out before releasing, and in particular before etching selectively the material of the second insulating layer towards the semi-conductor material of the second semi-conducting layer or during releasing, after said etching selectively of the material of the second insulating layer towards the semi-conductor material of the second semi-conducting layer.

According to a second possible implementation method, the first semi-conducting layer can be a support layer of a SOI substrate covered with said insulating layer of the SOI substrate, said second layer being a monocrystalline Si layer of the SOI substrate lying on said insulating layer.

After step b), the method can further comprise: forming at least a second insulating layer, so as to cover the second semi-conducting layer and the flanks of the mobile structure, the method further comprising the steps of:
- removing a given thickness of said second insulating layer facing said structure,
- releasing the mobile structure by selectively etching the material of the second insulating layer towards the semi-conductor material of the second semi-conducting layer.

The first insulating layer and the second insulating layer can be based on a same given dielectric material, releasing through selective etching comprising removing an area from the first insulating layer facing said mobile structure.

The given dielectric material can be $SiO_2$. In this case, the selective etching can be carried out using in vapour form.

Prior to the releasing step, a protecting layer can be formed on said second semi-conducting layer facing said transistor.

Prior to the releasing step, the method can comprise forming contacts and in the second insulating layer, interconnecting elements above such second insulating layer.

The given region of the first semi-conducting layer wherein a channel area is provided can be a doped area. Thus, step a) can comprise a step of doping said given region.

According to one possible implementation, the region can possibly be an intrinsic semi-conductor area.

The actuating and/or detecting means can be in a form of electrodes, for example for a capacity detection, or in form of lines, for example for a piezoresistive detection.

At least one pattern of said electromechanical component can be formed in the semi-conducting layer in step b), by etching, and so that the transistor gate is connected to this electrode.

At least one pattern of said component may be formed in the second semi-conducting layer and electrically connected to the transistor gate by an electrical connection formed by etching in the second semi-conducting layer during step b).

This pattern can be an electrode pattern, for example of a detecting electrode.

This allows to ignore different metal interconnection levels to implement the electrical link between the electromechanical component and the transistor.

The number of steps of the method for connecting these components can thus be reduced, while limiting the stray capacitance phenomena between the electromechanical component and the processing circuit connected to this component.

Setting a direct link between an electrode of an electromechanical component and the transistor gate allows to avoid a link via metal interconnection levels which generate stray capacitances.

By restricting the stray capacitances, it may be possible to provide a lower transistor gain, and thus to reduce consumption.

The transistor can belong to a processing analog circuit directly provided at the output of the electromechanical component and provided with at least one amplifying stage of the signal coming from the electromechanical component. An analog processing of the output signal of the electromechanical component can be carried out closest to the electromechanical component in order to improve the signal to noise ratio.

The transistor can be an amplifying transistor or arranged so as to operate as an amplifying transistor.

The transistor can be used to perform a direct amplification in a transimpedance connection of the output signal of the electromechanical component, for example an output signal coming from a capacitance variation resulting from the movement of the mobile structure of the component.

The transistor can be provided with a gate of a critical dimension between 0.13 µm and 0.35 µm.

The electromechanical component can be a NEMS component. In this case, the mobile structure can have a critical dimension between 1 nm and 1 µm.

DESCRIPTION OF THE DRAWINGS

The present invention will be better understood upon reading the description of exemplary embodiments given purely for indicative and in no way limiting purposes, referring to the accompanying drawings wherein.

Identical, similar or equivalent parts of the different figures bear the same reference numbers so as to make it easier passing from one figure to another.

The different parts represented in the figures are not necessarily drawn according to an uniform scale, for a better understanding of the figures.

DETAILED DESCRIPTION OF PARTICULAR EMBODIMENTS

An exemplary method for making a microelectronic device in accordance with the invention will now be given in relation with FIGS. 1A-1J and 2A-2B (the device being made is represented in FIGS. 1A-1J in a transverse cross-section view, only the elements located in the cross-section plan are represented in these figures).

The starting material of this method can be a substrate 100, which can be which can be a semi-conductor material-based (such as silicon) bulky substrate, also called "bulk".

In this substrate 100, a well or a doped area 104 can first be defined, wherein at least one channel area of a transistor is provided.

This doped area 104 can be made, for example, by implanting the substrate 100 with a doping which can be for example of the P type, for example using boron and with a concentration in the order of $1*10^{17}$ atoms$*$cm$^{-3}$.

According to one possibility, the region 104 of the substrate 100 wherein a transistor channel area is intended to be made, can be an intrinsic Si area.

Figure 1A:
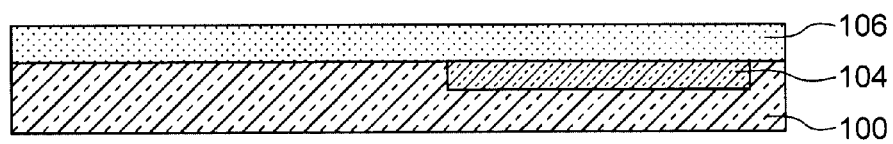
FIGS. 1A-1J and 2A-2B illustrate an exemplary method for making a microelectronic device comprising at least one electromechanical component and one transistor formed on a same substrate, the gate and the mobile structure of the electromechanical component being formed from a same Si layer.

An insulating layer 106 is then formed on the substrate 100. The dielectric material of the insulating layer 106 is a dielectric selected so as to be able to be etched selectively towards silicon. The dielectric material of the insulating layer 106 can be for example $SiO_2$ formed through thermal oxidation of the substrate, so as to make a dielectric thickness which may be for example in the order of around a hundred nanometers (FIG. 1A).

Figure 1B:
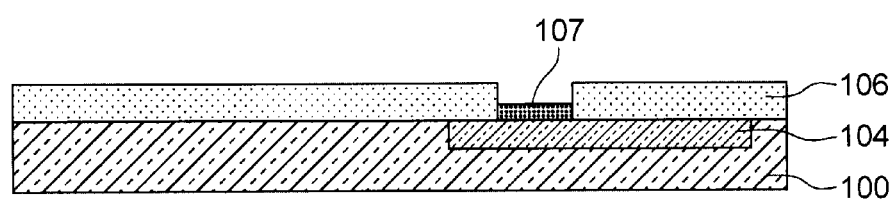

Then, the insulating layer 106 is etched, for example through wet etching, so as to form at least one aperture in an area of this layer 106 located facing the doped area 104, the aperture uncovering this doped area 104. In this aperture, a gate dielectric area 107 is then formed with a reduced thickness, for example between 5 and 10 nanometers. The gate dielectric can be formed for example by thermal oxidation of the substrate 100. This can allow to form a good quality dielectric (FIG. 1B).

Other apertures (not represented in FIG. 1B) in the insulating layer 106, wherein contacts are intended to be formed, can also be made.

Then, at least one hole uncovering substrate 100 in the insulating layer 106 is formed, in a region wherein a part of at least one NEMS—(Nano Electro-Mechanical System) or MEMS—(Micro Electro-Mechanical System) type electromechanical component is intended to be made. This hole can be formed, for example, through anisotropic etching of the insulating layer 106.

At the bottom of the hole, a $Si_{1-y}Ge_y$-based area 110 (with y for example in the order of 0.6) is then formed, by epitaxy growth on the substrate 100, for example so as to achieve a thickness in the order of 60 nanometers.

The epitaxy performed can be selective so that the $Si_{1-y}Ge_y$ is only formed on areas of substrate 100 which are located at the bottom of the hole. Thus, crystalline $Si_{1-y}Ge_y$ is formed.

Figure 1C:
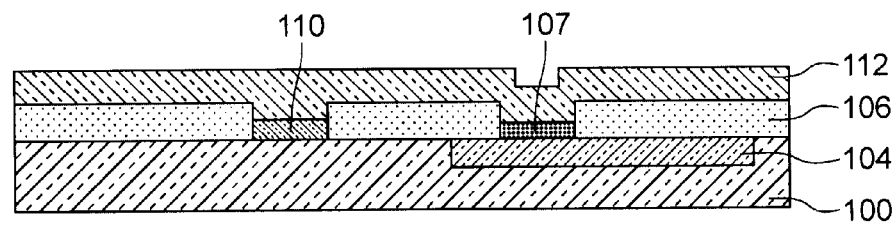

Then, a Si layer is grown, on the area(s) 110 of crystalline $Si_{1-y}Ge_y$, as well as on the insulating layer 106. This results in forming monocrystalline Si on the $Si_{1-y}Ge_y$-based area 110, and polycrystalline Si on the dielectric layer 106 (FIG. 1C).

And then, patterns $M_1$, $M_2$, $M_3$, and $M'_1$ are formed on the Si layer 112 (FIG. 1D), of which at least one pattern $M_1$ of a mobile structure 112a of the NEMS or MEMS electromechanical component, at least one pattern $M_2$ of a part 112b intended to form a first electrode for actuating and/or detecting the electromechanical component, at least one pattern $M_3$ of a part 112c intended to form a second electrode for actuating and/or detecting the electromechanical component, as well as at least one pattern $M'_1$ of a part 112d intended to form a gate of a transistor. The mobile structure 112a can comprise a part in the form of a bar. This bar can have a critical dimension dc which may be, for example, between 10 nanometers and 1 micrometer in the case where a NEMS structure is made.

The transistor gate pattern $M'_1$ formed in the layer 112 can be made so that the latter is connected to an electrode pattern of the electromechanical component. Thus, according to this possible implementation, the component and the transistor can be mutually connected and possibly biased by a same potential, without the necessity to provide an interconnecting using a higher metal level.

Figure 1D:
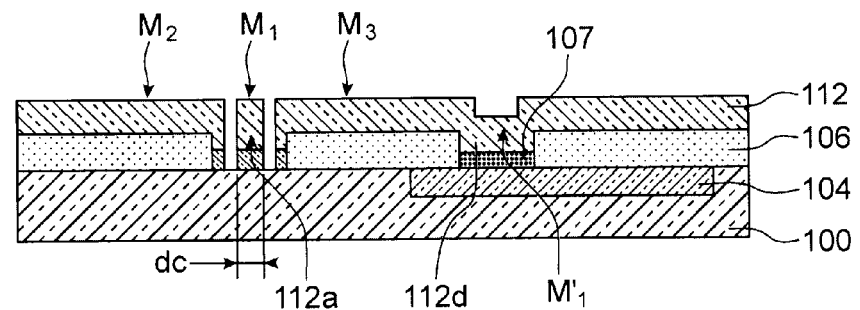
Figure 2A:
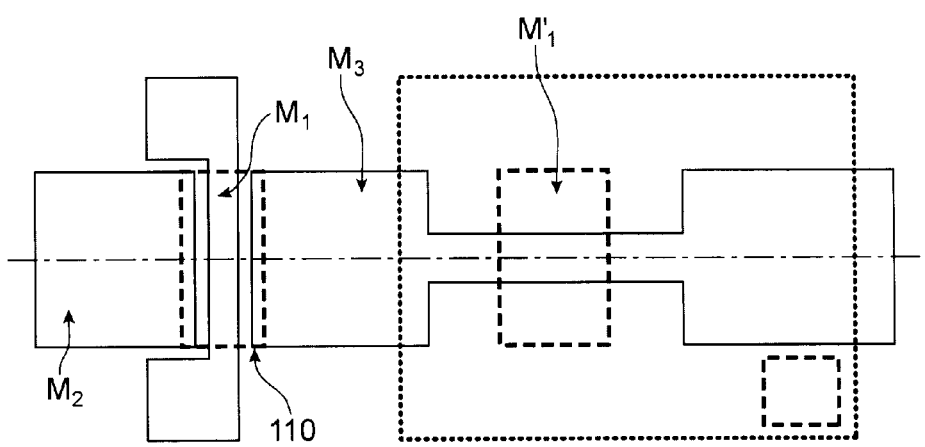

In this case, the link between the electromechanical component and the transistor can be provided with a critical dimension higher than the largest dimension of the mobile mechanical structure intended to be released, so as to only release this mobile structure during a subsequent step of releasing this mobile structure (FIG. 1D and FIG. 2A, FIG. 2A showing a top view of the patterns made in the monocrystalline Si layer to form parts of the component and the transistor, the SiGe area 110 and the areas wherein apertures have been made in the dielectric layer being bounded by dash lines in this figure whereas the area 104 is bounded by dotted lines).

The transistor being made can be a transistor of an analog circuit having at least one amplification function and which may be directly located at the output of the electromechanical component. This analog circuit can also include other transistors (not represented in the figures). The transistor can be an amplifying transistor including a channel, for example with a length between 0.1 µm and several µm or several ten micrometers, the critical dimension of the gate being for example between 0.13 µm and 0.35 µm.

Making these patterns $M_1$, $M_2$, $M_3$, and $M'_1$ may comprise a photolithography step during which a resin layer is exposed to an ultraviolet radiation, and then etching through this resin layer.

Alternately, making these patterns can comprise a photolithography step during which a resin layer is exposed to a far ultraviolet radiation, and then this resin layer is exposed to an electron beam (commonly called "e-beam"), and followed by anisotropically etching through the resin layer (not represented). This hybrid lithography using etching through electron beam allows to make some very small size patterns, for example in the order of several nanometers or several tens of nanometers.

And then, a removal of the $Si_{1-y}Ge_y$-based area is performed. This removal can be carried out for example through isotropic etching of $Si_{1-y}Ge_y$, for example using a plasma etching which may be performed for example using $CF_4$.

Figure 1E:
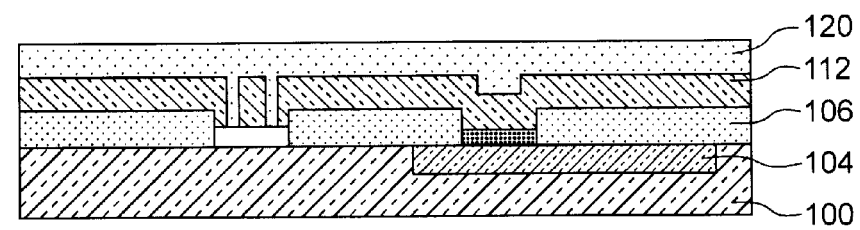
Figure 1F:
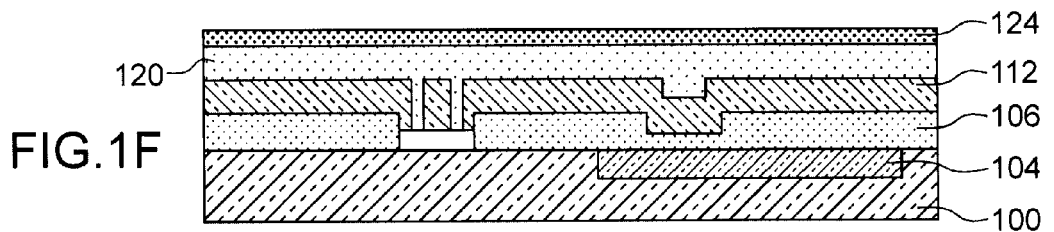

A dielectric material layer 120 is then deposited (FIG. 1E) on the Si layer 112, for example a $SiO_2$ layer allowing in particular to protect and maintain the electromechanical component and in particular the mobile structure 112a thereof. The dielectric material 120 can be for example deposited through a TEOS or SACVD process, with a thickness for example in the order of 150 nanometers. The dielectric material 120 may be deposited so as to cover the Si layer 112 and surround the mobile structure 112a of the component (FIG. 1E).

This depositing can be followed by a chemical-mechanical polishing (commonly called CMP).

Then, the source, drain and gate areas of the transistor can be doped, as well as the NEMS or MEMS structure, for example by performing an implantation.

In the case, advantageously, the Si layer 112 connects the structure of the MEMS or NEMS electromechanical component to the transistor, the area of this layer forming the link between the electromechanical component and the transistor can also be doped by implantation.

For this, a N+ doping, for example with phosphorus can be for example performed, according to a concentration which may be for example in the order of $1*10^{19}$ atoms*$cm^{-3}$, or between $1*10^{18}$ atoms*$cm^{-3}$ and $1*10^{21}$ atoms*$cm^{-3}$.

Then, another implantation, for example of the P++ type, of some areas of well 104 can be performed in order to form ohmic contacts.

And then, another implantation, for example of the N++ type, of some areas of the Si layer 112 can be performed in order to form ohmic type contacts for the gate, for the source, for the drain, as well as for the electrodes of the electromechanical component.

Then, another additional layer of dielectric material 124 can be deposited on the dielectric material layer 120. The deposition of this layer can be conformal.

The dielectric materials 120 and 124 are selected so as to be able to be etched selectively towards monocrystalline silicon, and can be $SiO_2$.

Figure 1G:
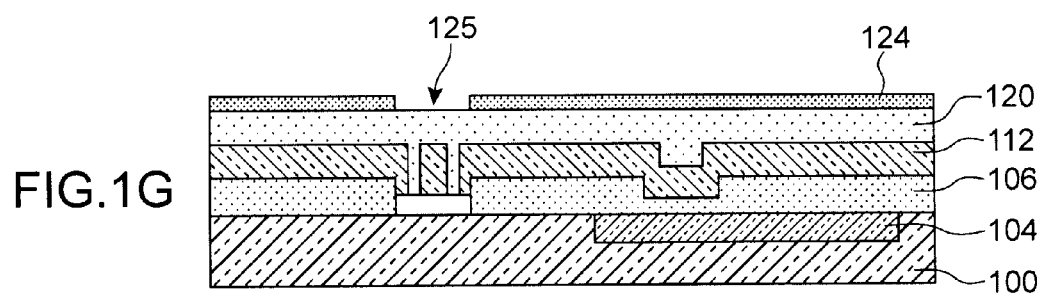
Figure 1H:
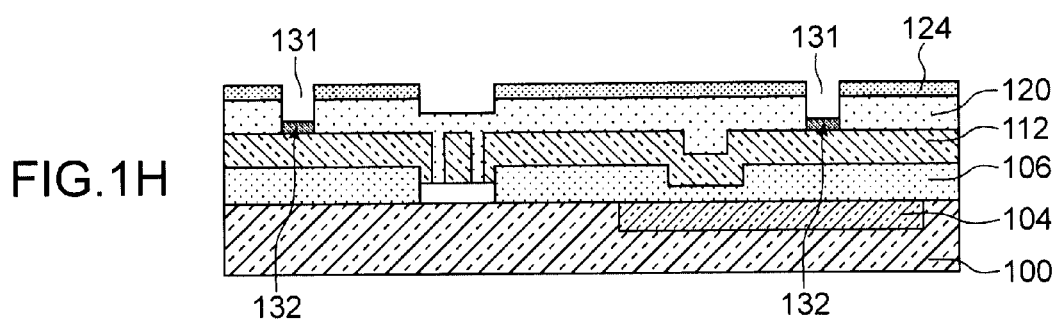

The stacked layers of dielectric materials 120 and 124 form an insulating layer a portion of which can then be removed in an area located above the mobile mechanical structure 112a of the MEMS or NEMS electromechanical component. This localised removal of the dielectric layers 120, 124 can be performed to subsequently allow to release the structure 112a without altering the rest of the semi-conducting layer 112 (FIGS. 1G and 1H).

And then (FIG. 1H), apertures 131 are made in the dielectric layers 120 and 124, so as to uncover the monocrystalline Si layer 112. Contacts 132 are then formed at the bottom of these apertures 131, for example by silicidizing the layer 112, so as to form PtSi- or NiSi-based areas for example.

Figure 1I:
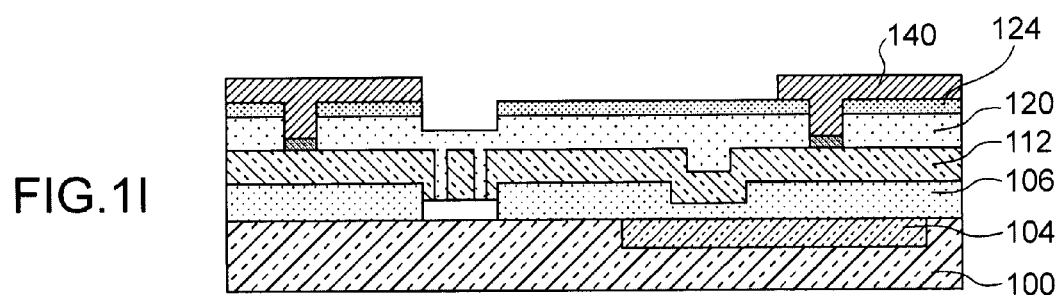
Figure 2B:
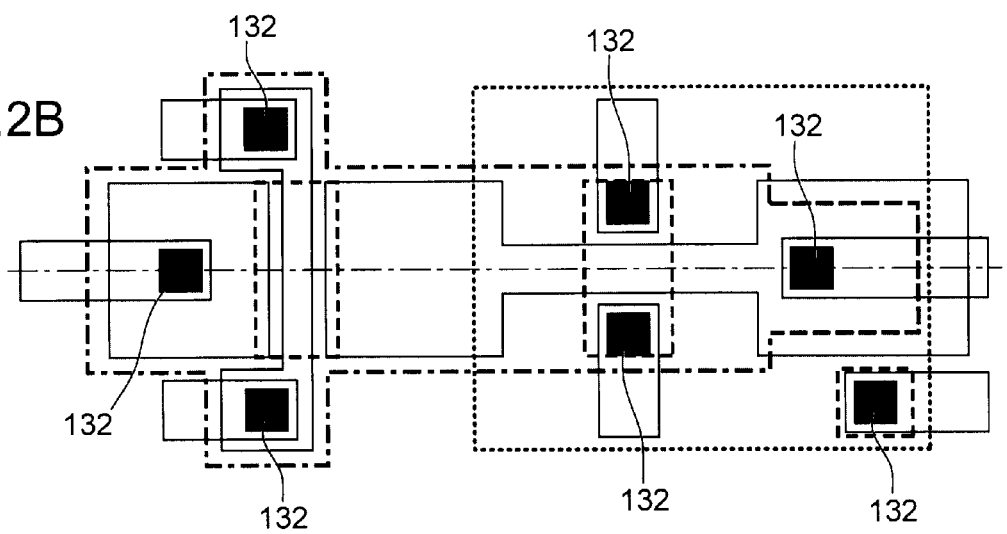

A first interconnecting metal level can then be made by depositing in the apertures 131a metal 140, or a metal alloy, for example AlSi filling the apertures 131 and covering the dielectric layer 124, wherein tracks or lines are formed (FIG. 1I and FIG. 2B illustrating the device in a top view, once the first interconnecting metal layer has been made).

An annealing of the metal can then be possibly performed. An annealing for activating dopants can also be performed.

And then, a release of the mobile mechanical structure 112a from the electromechanical component is performed. This release can be implemented isotropic etching of the dielectric layers 120 and 124.

Figure 1J:
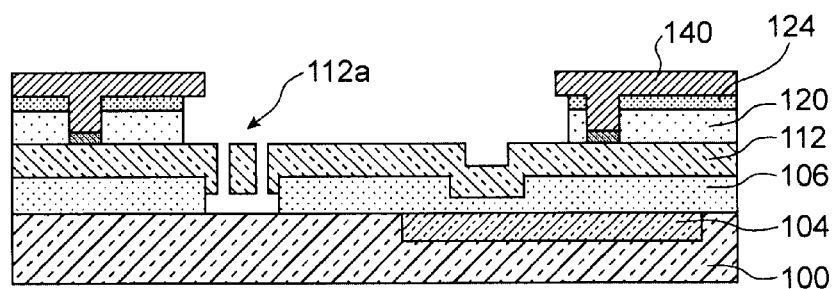

To release the structure 112a while avoiding needless etching of the parts of the monocrystalline Si layer 112, the stack of dielectric layers 120 and 124 is provided with a lower thickness in an area located above the mobile structure 112a. The release can be performed for example using HF. The use of HF vapour form can allow to restrict the adhesion risks of the mobile structure 112a upon release thereof (FIG. 1J).

According to an alternative exemplary method just described, the dielectric layer 124 can be formed by non-conformal deposition. In this case, the release of the mobile structure 112a can be performed by anisotropic etching of the dielectric layers 120 and 124.

In this exemplary method, a different thickness of dielectric material can be formed to insulate the electromechanical component of the substrate and to make the gate oxide of the transistor.

The semi-conducting layer wherein the structure of the electromechanical component and the transistor are made can also have localised thickness differences. For example, a higher thickness can be provided facing the mobile structure of the electromechanical component than for the transistor gate.

This can be achieved, for example using partial etchings, epitaxy resumptions, or different epitaxies.

Another exemplary method for making the microelectronic device in accordance with the invention will now be given in relation with FIGS. 3A-3F, and 4A-4B (the device is shown in FIGS. 3A-3F in a transverse cross-section view, only the elements located in a cross-section plan being represented in these figures).

The starting material of this method is, in this example, a substrate 200, of the SOI (Silicon On Insulator) type which may be formed of a silicon semi-conducting support layer 201, a buried oxide insulating layer 206 and a thin monocrystalline Si semi-conducting layer 212.

In the support layer 201 of the SOI substrate, first a well is made, that is a doped area 204 provided in particular for at least a transistor channel. This doping can be performed by photolithography of a layer (not represented) and then implantation through apertures formed in this layer, so as to dope some areas of the support 201, for example based on a P doping, which may be made using boron, at a concentration for example of $1^e17$ atoms*$cm^{-3}$.

Then, in the monocrystalline Si semi-conducting layer 212, patterns $M_1$, $M_2$, $M_3$, are defined, of at least one NEMS- or MEMS-type electromechanical component of which at least one pattern $M_1$ of a structure 212a intended to form the mobile parts of the electromechanical component, as well as the patterns $M_2$, $M_3$ of electrodes 212b, 212c of this component.

Patterns of at least one transistor are also made, and in particular a pattern $M'_1$ of a gate electrode 212d.

Figure 3A:
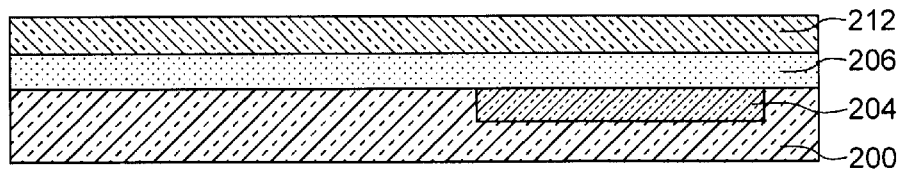
FIGS. 3A-3F and 4A-4B illustrate another exemplary method for making a microelectronic device comprising at least one electromechanical component and one transistor formed on a same substrate, the gate and the mobile structure of the electromechanical component being formed from a same monocrystalline Si layer.
Figure 3B:
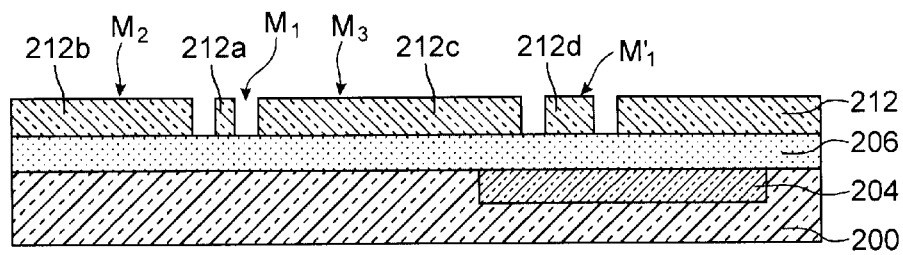
Figure 3C:
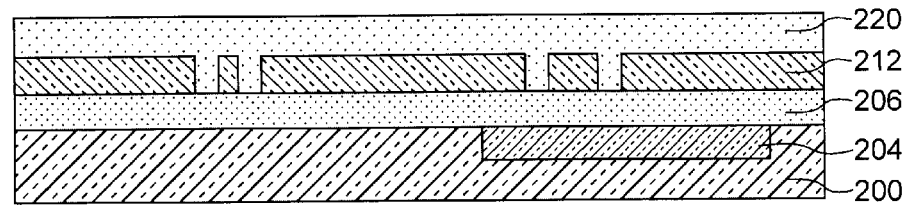
Figure 4A:
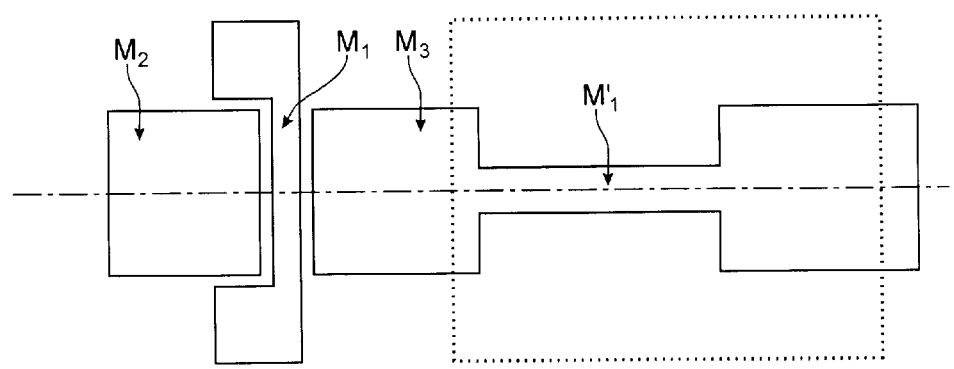

The semi-conducting layer 212 can be advantageously structured so that an electrode of the electromechanical component formed in this layer is connected to the gate of the transistor, both elements being able to be biased via bias potential (FIG. 3B and FIG. 4A, FIG. 4A showing the patterns made in the semi-conducting layer 212 in a top view, the doped area 204 located under the semi-conducting layer 212 being also represented).

The patterns in the monocrystalline Si layer can be made by photolithography, and then etching, for example anisotropic etching, which can be performed using a plasma with, for example $SF_6$.

According to an alternative, the patterns may be obtained using a photolithography step, or using a step DUV (Deep Ultra Violet) optical photolithography to form some patterns, and of lithography by electron beam to make some other small size patterns.

Then (FIG. 3C), a layer of dielectric material 220 is formed, so as to cover the patterns made in the monocrystalline Si layer 212 and to make the stack of layers planar. This can be performed by depositing a silicon oxide, using for example a TEOS or SACVD (Sub-Atmospheric Chemical Vapour Deposition) method so as to form a layer with a thickness for example in the order of 150 nanometers. The dielectric material 220 is chosen so as to be able to be etched selectively towards monocrystalline Si of the layer 212. A CMP polishing step can then be performed.

And then, using photolithography and implantation steps, a doping of the source, drain and gate of the transistor is carried out, as well as of at least some areas of the electromechanical component, and possibly of the part connecting the transistor with this component.

This doping can be performed for example by N+ doping, with phosphorus, at a concentration for example of $1^{e19}$ atoms*$cm^{-3}$ or between $1^{e18}$ atoms*$cm^{-3}$ and $1^{e21}$ atoms*$cm^3$.

A diffusion annealing can then be carried out to allow to homogenize the dopant distribution, in particular in the thickness of the monocrystalline silicon of the area of the MEMS or NEMS component.

Next, using photolithography and implantation steps, the well 204 can be doped again, and in particular areas of the latter wherein at least one ohmic contact with a metal interconnection element is intended to be made, for example by P++ doping.

And then, a second layer of dielectric material 224 is deposited, such as a silicon oxide layer in order to provide, in particular, an electrical insulation of monocrystalline silicon structures towards interconnecting metal levels intended to be subsequently made.

Figure 3D:
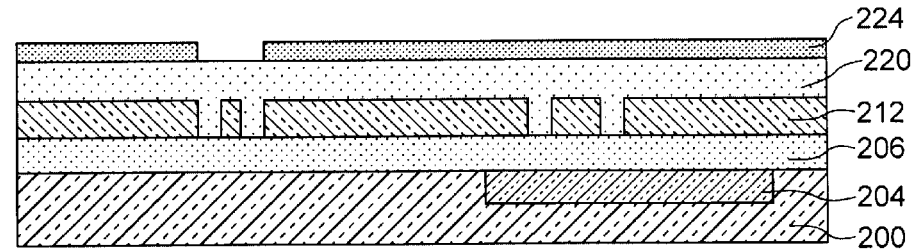

A thinning of the second dielectric layer 224 in an area located above the electromechanical component can then be made (FIG. 3D). The thicknesses of the dielectric layers 220 and 224 and the distribution of these layers are provided according to a subsequent final releasing step of the mobile structure of the electromechanical component. As well as for the dielectric material 220, the dielectric material 224 is selected so as to be able to be etched selectively towards monocrystalline silicon.

Figure 3E:
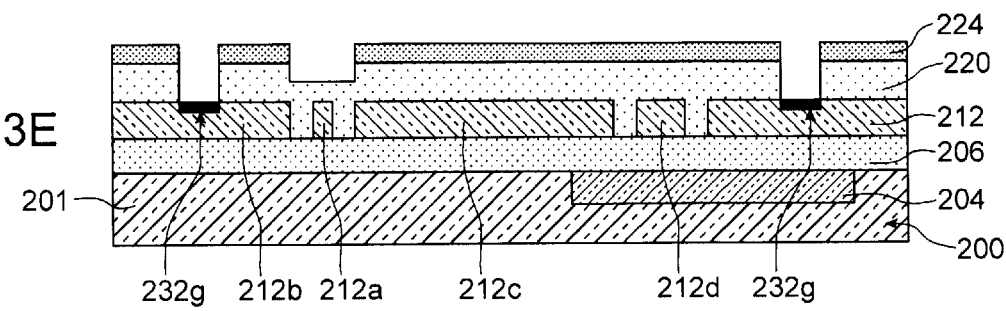
Figure 4B:
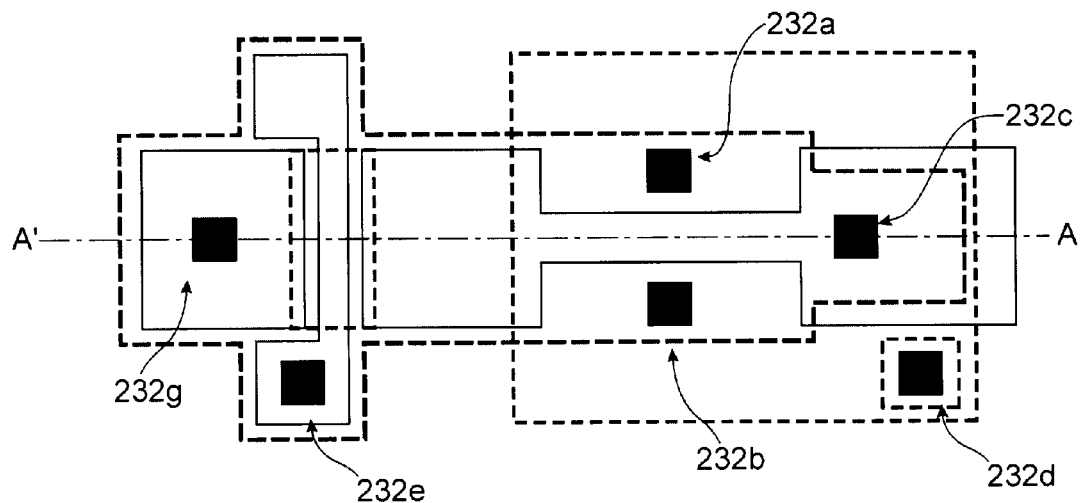

Next, a plurality of contacts are formed, among which contacts 232a, 232b, for the source and drain areas, at least one contact 232c which can be for the transistor gate 212d and shared by one of the electrodes of the electromechanical component, a contact 232d for the well 204, a contact 232e for the mobile part of the electromechanical component, and a contact 232g for an electrode of the electromechanical component. These contacts 232a, 232b, 232c, 232d, 232e, 232g can be made by forming apertures in the dielectric layers 220, 224, so as to uncover the monocrystalline silicon layer 212, and then silicidizing the monocrystalline silicon layer 212, for example in order to form NiSi- or PtSi-based areas, for example (FIG. 3E and FIG. 4B representing in a top view the patterns formed in the monocrystalline Si layer, as well as the contacts made on this layer).

Figure 3F:
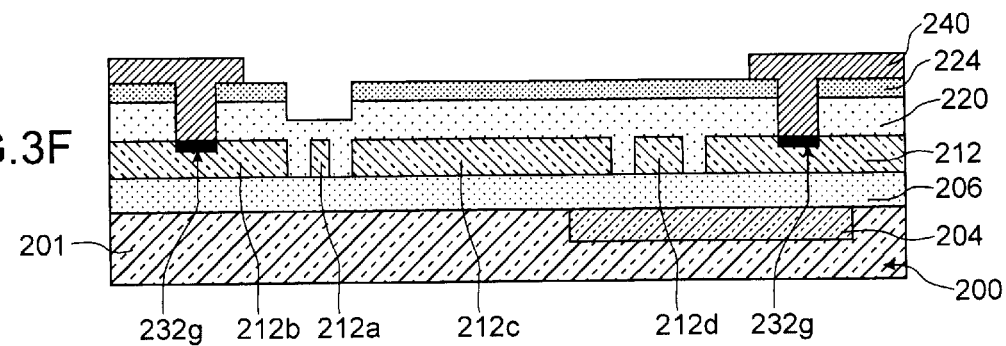

And then, the interconnecting elements are made on the contacts, for example by depositing a metal alloy 240 such as AlSi, and then photolithography, and then etching this metal alloy 240 (FIG. 3F).

Next, an annealing of the metal, and an annealing for activating dopants can be performed.

Then, the mobile mechanical structure 212a is released from the NEMS or MEMS electromechanical component by etching dielectric materials 220 and 224.

For this, an isotropic etching using HF can be performed in the case the dielectric materials 220 and 224 are silicon oxide-based. The use of HF vapour form can allow to reduce the adhesion risks of the mobile element 212a when it is released.

The thickness of the dielectric layers 220, 224 may have been made lower facing the electromechanical component to allow the release thereof and sufficiently high above the rest of the stack to allow to protect the other parts of the stack.

Figure 5:
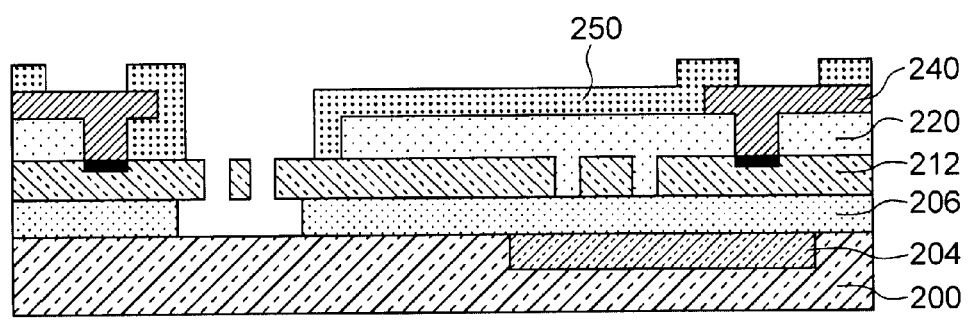
FIG. 5 illustrates an alternative step of releasing a mobile structure of a electromechanical component performed during an exemplary method in accordance with the invention.

According to an alternative embodiment (FIG. 5), a protecting layer 250 can be provided above the transistor before performing the step of releasing the NEMS/MEMS component, without altering the dielectric layers 220, 224, above the latter. This protecting layer 250 can be for example $Si_3N_4$-, amorphous Si-, or $HfO_2$-based.

The protecting layer 250 can be deposited, for example, in a conformal manner after anisotropically etching the layers 220, 224 and locally etched so as to allow access to the electromechanical component.

Insulating structures (not represented) for example of the STI (shallow trench isolation) type, or LOCOS can also be made.

According to a possible implementation (not shown), spacers can have been provided to improve the electrical performances of the transistor.

Implanted areas, for example of the LDD type, can also be made.

Figure 6:
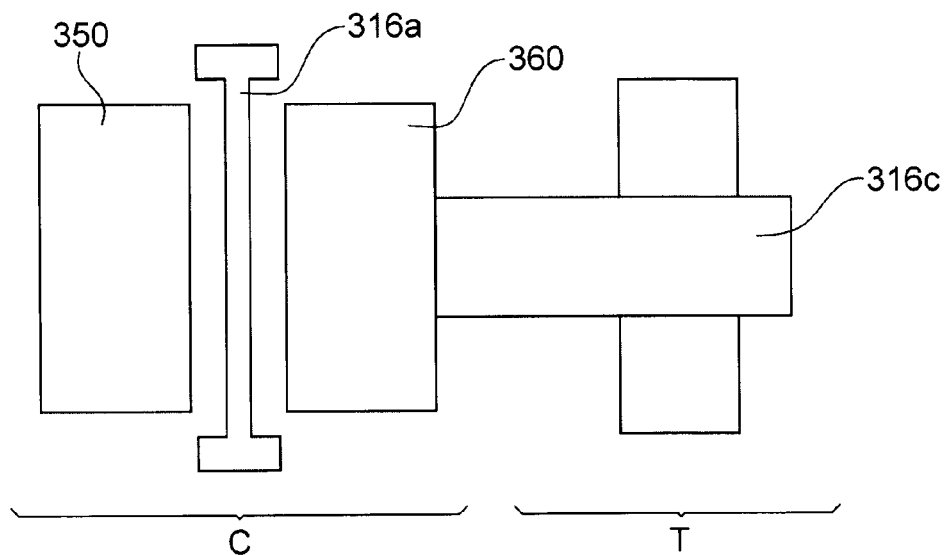
FIGS. 6 and 7 illustrate an exemplary microelectronic device implemented using a method in accordance with the invention and provided with a MEMS or NEMS electromechanical component having a mobile structure of monocrystalline Si and at least one transistor the gate of which has been formed in the same layer as said mobile structure.

In FIG. 6, an exemplary microelectronic device implemented using a method according to the invention and provided with a NEMS and/or MEMS electromechanical component (reference C in this figure) having a mobile structure 316a of monocrystalline Si and at least one transistor (reference T in this figure) the gate 316c of which has been formed in the same layer 316 as said mobile structure, is given.

The device is also provided with means for actuating and/or detecting the mobile structure which may be of the electrostatic, thermoelastic, piezoelectric, thermal or magnetic type.

In FIG. 6, the electromechanical component C includes actuating means in the form of an electrode 350 and detecting means in the form of an electrode 360.

The component C can also be provided with means for detecting movements of the mobile structure, for example of the capacitive or piezoresistive type.

In the example of FIG. 6, the detecting means are provided with an electrode 360 formed in the layer 316 and connected to the gate 316 of the transistor through this layer 316.

Figure 7:
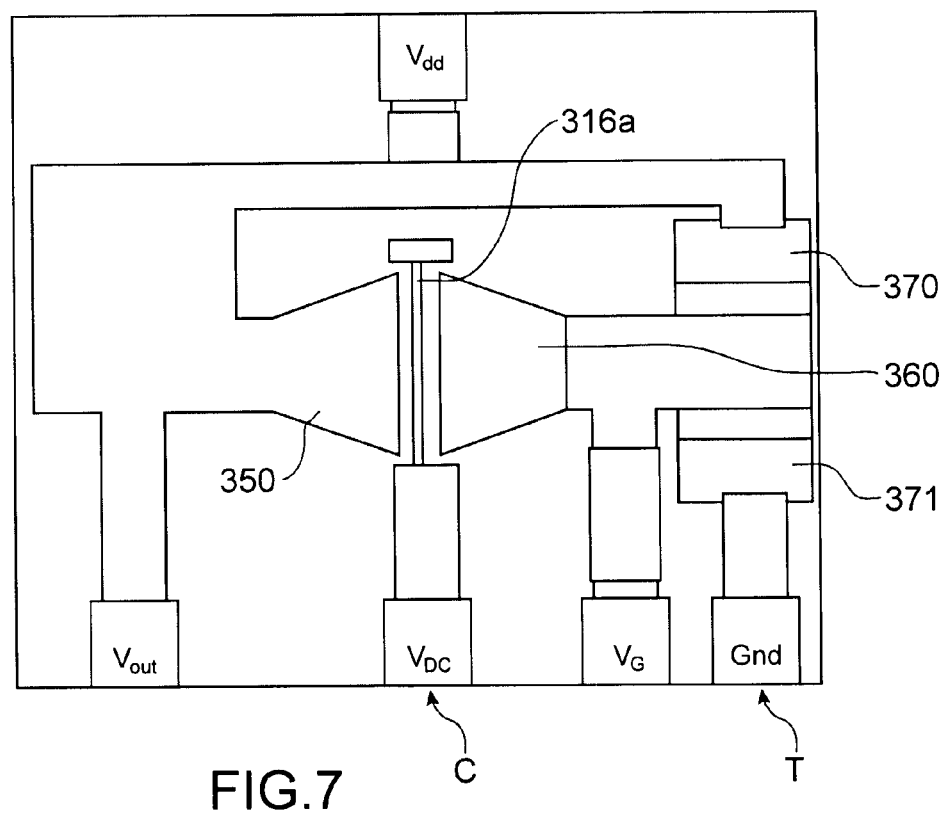

An alternative of this device is given in FIG. 7.

According to this alternative, the drain 370 of the transistor T is connected to the electrode 350 for actuating the electromechanical component and to a potential Vdd, whereas the mobile structure 316a is in the form of a bar put at a potential Vdc. The gate 316c of the transistor T is connected to the electrode 360 for detecting the component and at a potential Vg, whereas the source 371 of the transistor T is put to a reference potential. This device forms a basic oscillator. This kind of device is suitable for low consumption applications, and can possibly belong to an array including a plurality of associated components C and transistors T. Such an array can be integrated, for example, in a chemical or biological sensor, or an inertial sensor such as a vibration sensor, an accelerometer, or a gyrometer, or in a resonant system provided with electromechanical resonators, for example in RF applications of time reference, filters, or VCO.

The invention claimed is:

1. A method for making a microelectronic device including, on a same substrate, at least one electro-mechanical component including a mobile structure of a monocrystalline semi-conductor material and an actuation and/or detection structure for actuating and/or detecting the mobile structure movements, and with at least one transistor having a gate connected to the mobile structure and made of the monocrystalline semi-conductor material, the method comprising:
  a) providing a substrate including at least a first semi-conducting layer including at least one channel region in which a channel of the transistor is provided, the first semi-conducting layer being covered with an insulating layer, the insulating layer being covered with a second semi-conducting layer based on the monocrystalline semi-conductor material; and
  b) etching the second semi-conducting layer, so as to form in the second semi-conducting layer at least one mobile structure pattern for the component, and at least one gate pattern for the transistor, the gate pattern being on a gate dielectric area located facing the channel region provided in the first semi-conducting layer, the mobile structure pattern and the gate pattern being connected to each other by the second semi-conducting layer based on the monocrystalline semi-conductor material.

2. The method according to claim 1, wherein the first semi-conducting layer is a layer of a substrate, the method further comprising, prior to the etching b): forming the insulating layer onto the substrate.

3. The method according to claim 1, wherein the method further comprises: at least partially removing one area from the insulating layer to form the gate dielectric area.

4. The method according to claim 1, wherein a material of a sacrificial area is selected to be etched selectively towards the material of the first semi-conducting layer and the second semi-conducting layer.

5. The method according to claim 4, wherein: the material of the sacrificial area is $Si_xGe_{1-x}$.

6. The method according to claim 5, further comprising, after forming the sacrificial area:
  forming at least one second insulating layer, so as to cover the second semi-conducting layer and surround flanks of the mobile structure;
  removing a given thickness of the second insulating layer facing the structure;
  releasing the mobile structure by etching selectively the second insulating layer towards the semi-conductor material of the second semi-conducting layer.

7. The method according to claim 6, further comprising: removing the sacrificial $Si_xGe_{1-x}$-based area.

8. The method according to claim 6, wherein the first insulating layer and the second insulating layer are based on a same given dielectric material, releasing through selective etching comprising removing an area from the first insulating layer facing the mobile structure.

9. The method according to claim 8, wherein the given dielectric material is $SiO_2$, the selective etching being carried out using HF in vapor form.

10. The method according to claim 6, wherein, prior to the releasing, a protecting layer is formed on the second semi-conducting layer facing the transistor.

11. The method according to claim 6, further comprising, prior to the releasing, forming contact in the second insulating layer and interconnecting elements.

12. The method according to claim 1, wherein, in the etching b), at least one pattern of the component is formed in the second semi-conducting layer and connected to the transistor, or to the gate of the transistor.

13. The method according to claim 1, wherein, in the etching b), at least one pattern of the component is formed in the second semi-conducting layer and electrically connected to the transistor gate by an electrical connection formed by etching in the second semi-conducting layer during the etching b).

14. The method according to claim 1, wherein the transistor is an amplifying transistor and/or belongs to an analog circuit including at least one amplifying stage.

15. A method for making a microelectronic device including, on a same substrate, at least one electro-mechanical component including a mobile structure of a monocrystalline semi-conductor material and an actuation and/or detection structure for actuating and/or detecting the mobile structure movements, and with at least one transistor having a gate connected to the mobile structure and made of the monocrystalline semi-conductor material, the method comprising:
  a) providing an SOI substrate including at least a first semi-conducting layer including at least one channel region in which a channel of the transistor is provided, the first semi-conducting layer being a support layer of the SOI substrate covered with an insulating layer, the insulating layer being covered with a second semi-conducting layer of the SOI substrate, the second semi-conducting layer including the monocrystalline semi-conductor material; and
  b) etching the second semi-conducting layer so as to form at least one mobile structure pattern for the at least one electro-mechanical component and at least one gate pattern for the transistor, the gate pattern being on a gate dielectric area located facing the channel region provided in the first semi-conducting layer, the mobile structure pattern and the gate pattern being directly connected to each other by the second semi-conducting layer based on the monocrystalline semi-conductor material.

* * * * *

UNITED STATES PATENT AND TRADEMARK OFFICE
CERTIFICATE OF CORRECTION

| | | |
|---|---|---|
| PATENT NO. | : 8,580,597 B2 | Page 1 of 1 |
| APPLICATION NO. | : 13/257756 | |
| DATED | : November 12, 2013 | |
| INVENTOR(S) | : Eric Ollier et al. | |

It is certified that error appears in the above-identified patent and that said Letters Patent is hereby corrected as shown below:

On the title page, Item (86) should read:

--(86) PCT No.:     PCT/EP2010/054023

§ 371 (c)(1),
      (2), (4) Date:   Sep. 20, 2011--

Signed and Sealed this
Fourth Day of February, 2014

Michelle K. Lee
*Deputy Director of the United States Patent and Trademark Office*